United States Patent [19]

Komatsu et al.

[11] Patent Number: 4,516,147
[45] Date of Patent: May 7, 1985

[54] SEMICONDUCTOR DEVICE HAVING A SUBSTRATE COVERED WITH A HIGH IMPURITY CONCENTRATION FIRST POLYCRYSTALLINE LAYER AND THEN A LOWER IMPURITY CONCENTRATION SECOND POLYCRYSTALLINE LAYER

[75] Inventors: Shigeru Komatsu, Yokohama; Hiroshi Inoue, Kitakyushuu, both of Japan

[73] Assignee: Tokyo Shibaura Denki Kabushiki Kaisha, Kawasaki, Japan

[21] Appl. No.: 582,857

[22] Filed: Feb. 24, 1984

Related U.S. Application Data

[63] Continuation of Ser. No. 272,918, Jun. 12, 1981, abandoned.

[30] Foreign Application Priority Data

Jun. 19, 1980 [JP] Japan ................................ 55-83126

[51] Int. Cl.³ ..................... H01L 29/04; H01L 23/48; H01L 29/34
[52] U.S. Cl. ........................................ 357/59; 357/54; 357/65; 357/68; 357/90
[58] Field of Search ...................... 357/15, 54, 59, 65, 357/68, 90

[56] References Cited

U.S. PATENT DOCUMENTS

| | | | |
|---|---|---|---|
| 3,881,242 | 5/1975 | Nuttall et al. | 357/59 X |
| 4,087,571 | 5/1978 | Kamins et al. | 427/86 |
| 4,128,845 | 12/1978 | Sakai | 357/68 X |
| 4,146,902 | 3/1979 | Tanimoto et al. | 357/59 X |
| 4,157,269 | 6/1979 | Ning et al. | 148/1.5 |
| 4,210,689 | 7/1980 | Komatsu | 357/54 |
| 4,227,203 | 10/1980 | Mikoshiba | 357/59 |
| 4,239,559 | 12/1980 | Ito | 148/188 |

Primary Examiner—Andrew J. James
Assistant Examiner—J. Carroll
Attorney, Agent, or Firm—Cushman, Darby & Cushman

[57] ABSTRACT

A semiconductor device has a semiconductor substrate of a first conductivity type, and a diffused region of a second conductivity type. A first insulation film is formed on the substrate, having an opening exposing the surface of the diffused region. First and second polycrystalline layers doped with impurities associated with the second conductivity type are disposed in the opening, and the concentration of the impurities of the first polycrystalline layer is higher than that of the second polycrystalline layer. A metal electrode is formed on the second polycrystalline layer.

4 Claims, 21 Drawing Figures

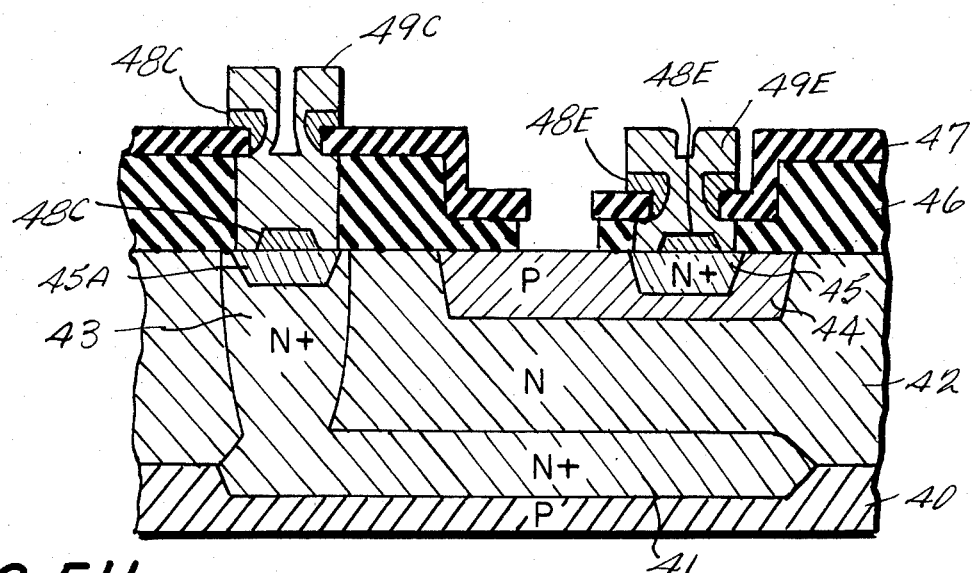
F I G. 5H
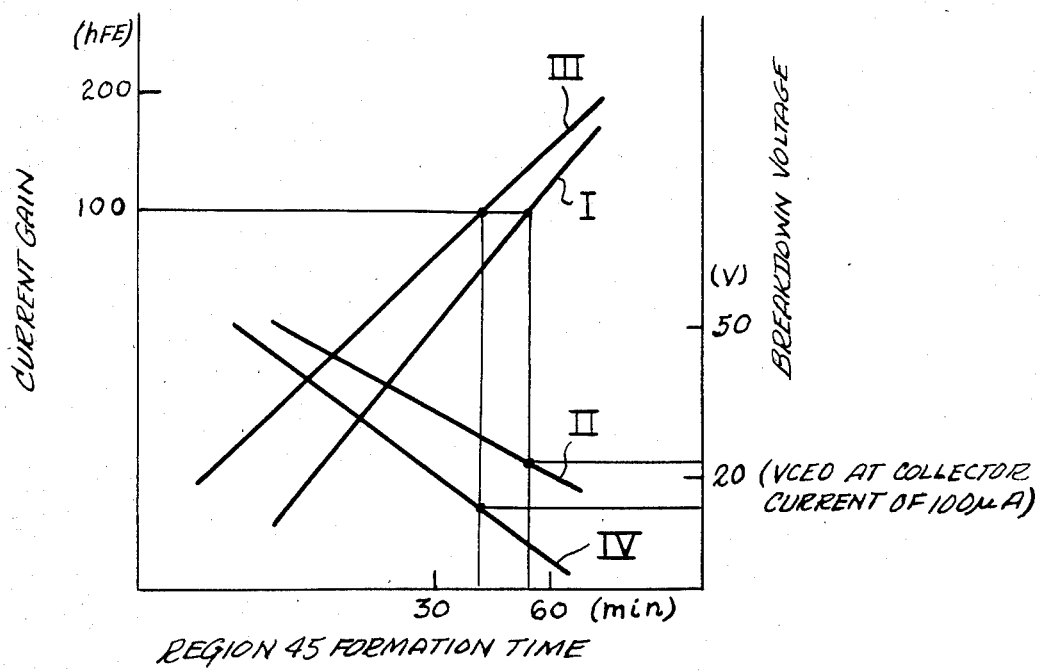
F I G. 6

SEMICONDUCTOR DEVICE HAVING A SUBSTRATE COVERED WITH A HIGH IMPURITY CONCENTRATION FIRST POLYCRYSTALLINE LAYER AND THEN A LOWER IMPURITY CONCENTRATION SECOND POLYCRYSTALLINE LAYER

This is a continuation of application Ser. No. 272,918, filed June 12, 1981, now abandoned.

BACKGROUND OF THE INVENTION

This invention relates to semiconductor devices, and more particularly to an improved electrode structure for semiconductor devices.

It is well known to use a polycrystalline silicon layer doped with impurities as a diffusion source and also a part of an electrode. FIGS. 1A to 1E show a well known semiconductor device and a method for producing the device.

In FIG. 1A, a silicon substrate 10 is doped with P type impurities, for example boron. On substrate 10, an insulation film 11 made of silicon oxide, for example, is formed generally by thermal oxidation of the surface region of substrate 10. A second insulation film 12, such as silicon nitride film, is formed on silicon oxide film 11, and then, is partly removed by photo etching so as to provide opening 14. The remaining portions of silicon nitride film 12 are used as the mask in the subsequent steps of providing silicon oxide film 11 with opening 15 to expose the surface of the substrate 10 (FIG. 1B). In this step, the silicon oxide film 11 is etched laterally as well as vertically, so silicon nitride film 12 overhangs silicon oxide film 11. Then a polycrystalline layer 16 doped with impurities producing N-type semiconductors, such as arsenic, is applied by chemical vapor deposition (CVD) to cover openings 14 and 15. The structure is then heated to diffuse the impurities of polycrystalline layer 16 into substrate 10 to form a diffused region 17 (FIG. 1D). Then an activating treatment, using fluoric acid or an aqueous solution of ammonium fluoride, is performed, and after that a metal electrode 18 is formed.

In this prior art device and method, the following problems exist. First, the overhanging portion of polycrystalline layer 16 tends to be broken, particularly when layer 16 is thin. Furthermore, in the activating treatment for improving the ohmic contact between metal electrode 18 and the polycrystalline layer, silicon oxide film 11 is further etched laterally, so a short-circuit between the metal electrode and the silicon substrate occurs more easily and often.

Second, to overcome the above-mentioned short-circuit problem, it is necessary to prepare or form a thick polycrystalline layer as shown in FIG. 2. However, this polycrystalline layer is used as a diffusion source, so this layer should be doped with impurities at high concentration. But the growth rate of the highly doped polycrystalline layer is low, so much time is necessary to form the thick polycrystalline layer, and therefore the semiconductor device.

SUMMARY OF THE INVENTION

It is an object of this invention to provide an improved structure of a semiconductor device which can be produced in a short time.

Another object of this invention is to provide an improved structure of a semiconductor device which has high breakdown voltage.

These objects are achieved in the present invention with a semiconductor device that has a semiconductor substrate of a first conductivity type. An insulation film is formed on the substrate, having an opening exposing the surface of the substrate.

First and second polycrystalline layers, doped with impurities associated with a second conductivity type are disposed in the opening. The concentration of the impurities of the first polycrystalline layer, directly adjacent to the substrate, is higher than that of the second polycrystalline layer. This structure is then heated so as to diffuse the impurities of the first polycrystalline layer into the substrate forming a diffused region of the second conductivity type.

A metal electrode is then formed on the second polycrystalline layer.

This particular structure produces a higher breakdown voltage than the prior art structure. Also, this structure solves the short-circuiting problem inherent in the prior art method. Finally, the present invention may be produced much more rapidly than the prior art device.

BRIEF DESCRIPTION OF THE DRAWINGS

These and other objects and advantages will become apparent and more readily appreciated from the following detailed description of the presently preferred exemplary embodiments of this invention, taken in conjunction with the following drawings of which:

FIGS. 5A to 5H are cross sectional views illustrating the method of producing the semiconductor device in FIG. 4; and FIG. 6 is a diagram showing the effects of this invention.

DESCRIPTION OF PREFERRED EMBODIMENTS

Figure 3A:
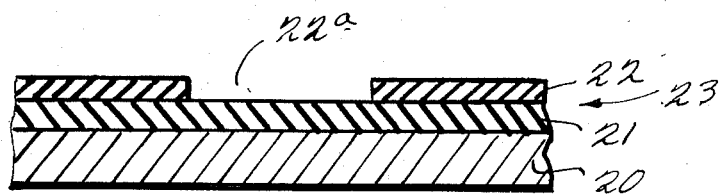
FIGS. 3A to 3E are cross sectional views of the structure of and method of producing a semiconductor device according to this invention.

FIG. 3A illustrates a semiconductor substrate 20 of P conductivity type. It is preferable to choose the sheet resistance of substrate 20 in the range 300 k$\Omega$/□ to 1000 k$\Omega$/□.

On substrate 20, an insulation layer 21, made of, for example, silicon oxide is formed by a thermal oxidation process. It is preferable to choose the thickness of oxide layer 21 in the range of 1000 to 2000 Angstrom.

Figure 3B:
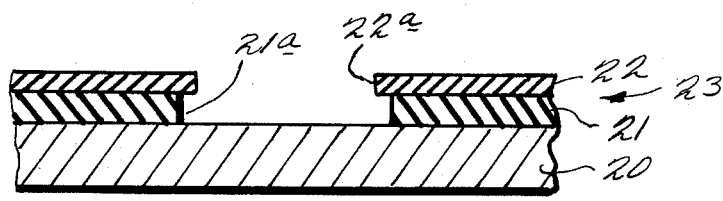
Figure 3C:
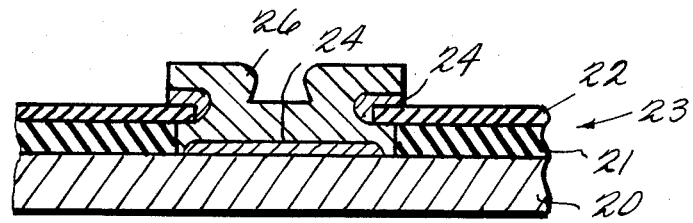
Figure 3D:
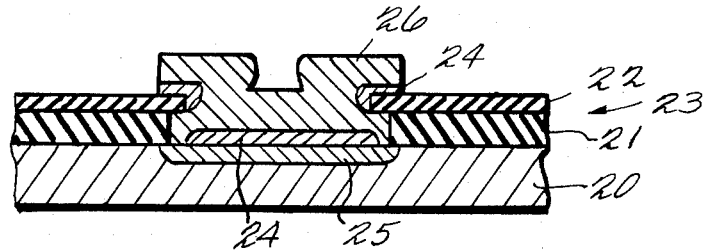
Figure 3E:
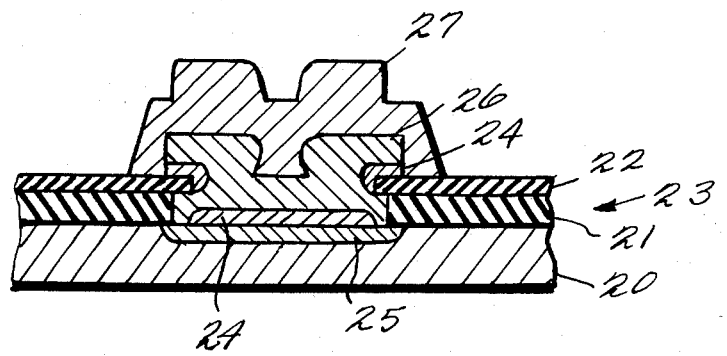

On silicon oxide layer 21, a second insulation layer 22, made of, for example, silicon nitride is formed with a thickness of 1000 Angstrom by a CVD process. Silicon nitride film 22 is partly removed by photo etching so as to provide an opening 22a. The remaining portion of silicon nitride film 22 is used as the mask in the subsequent steps of providing silicon oxide film 21 with opening 21a to expose the surface of substrate 20 (FIG. 3B). Then a first polycrystalline layer 24, doped with arsenic, is formed so as to cover the exposed surface of the substrate. The concentration of the arsenic in the polycrystalline layer is between about 0.6 to $2 \times 10^{21}$/cm$^3$.

The thickness of polycrystalline layer 24 is preferably between 300 and 600 Angstrom.

Then on layer 24, a second polycrystalline layer 26, doped with arsenic, is formed. The concentration of the impurities of second polycrystalline layer 26 is lower than that of first polycrystalline layer 24, preferably between $1 \times 10^{20}/cm^3$ and $5 \times 10^{20}/cm^3$. The thickness of second layer 26 is preferably between 2000 and 4000 Angstrom. Thus, the thickness of layer 26 may be 3 to 10 times greater than the thickness of layer 24.

First and second polycrystalline layers 24 and 26 can be obtained by thermal deposition of monosilane ($SiH_4$) mixed with an impurity reaction gas, such as arsenic, in helium gas (He) atmosphere at a temperature around 600° C. to 800° C. The concentration of the impurities doped in the polycrystalline layers can be controlled by changing the content ratio of the reaction gas. It should be noted that the concentration of impurities in second polycrystalline layer 20 is 1/1.5 to 1/100 compared with that of first polycrystalline layer 24, so the growth rate of second polycrystalline layer 26 is about 5 to 20 times faster as that of first layer 24.

Then these polycrystalline layers are removed except the portions around openings 21a and 22a. Thereafter a thermal treatment is performed for 60 minutes at 1000° C. so as to form diffused region 25 by diffusing the impurities of first polycrystalline layer 24 into substrate 20.

After an activating treatment using a fluoric acid or an aqueous solution is performed, a metal electrode 27, made of, for example, aluminum, is formed by evaporating the metal in the desired pattern.

Generally, the concentration of the impurities of first polycrystalline layer 24 should be high to provide a diffusion source, and that of second polycrystalline layer 26 should be chosen considering the resistance between diffused region 25 and electrode 27. The total thickness of layers 24 and 26 should be determined by the thickness of oxide layer 21, and is preferably greater than half the thickness of oxide layer 21 so as to solve the short-circuit problem between substrate 20 and electrode 27.

When first polycrystalline layer 24 is 500 Angstrom and second polycrystalline layer 26 is 2500 Angstrom, the total time to produce these layers is about ⅓ compared with the prior structure consisting only of a highly doped 3000 Angstrom polycrystalline layer.

Figure 4:
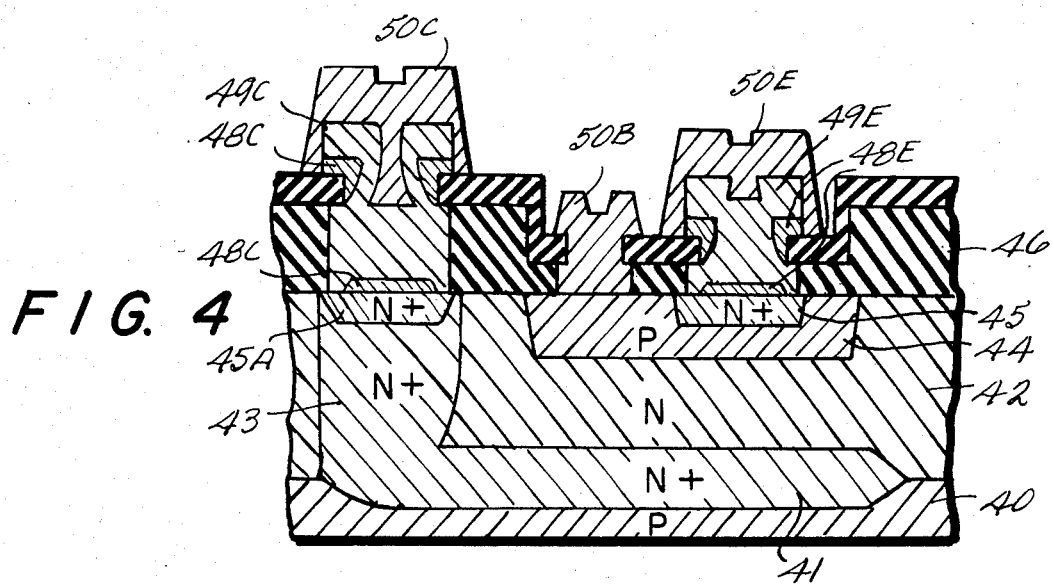
FIG. 4 is a cross sectional view of another semiconductor device made in accordance with this invention.

FIG. 4 is a cross sectional view of a semiconductor device, namely an NPN transistor according to this invention. In this embodiment, the electrode structure according to this invention, is employed with the collector and emitter electrodes. Namely, numeral 45 shows an emitter region of N conductivity type formed in P conductivity type base region 44. N-type layer 42, N+-type buried layer 41 and N+-type regions 43 and 45A operate as the collector region of this NPN transistor.

Figure 5A:
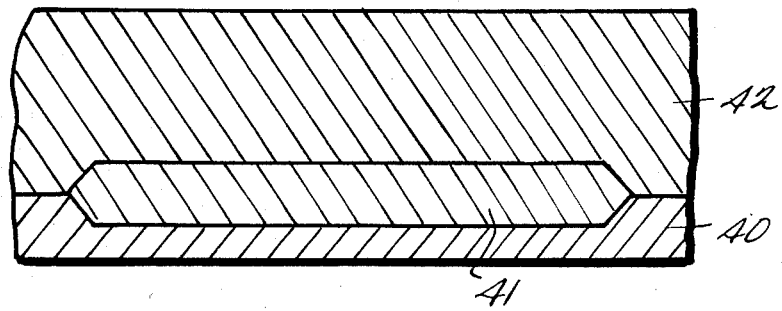

This NPN transistor can be produced as shown in FIGS. 5A to 5H. On semiconductor substrate 40 of P-type, an N+-type buried layer 41 and N-type epitaxial layer 42 are formed by conventional processes (FIG. 5A).

Figure 5B:
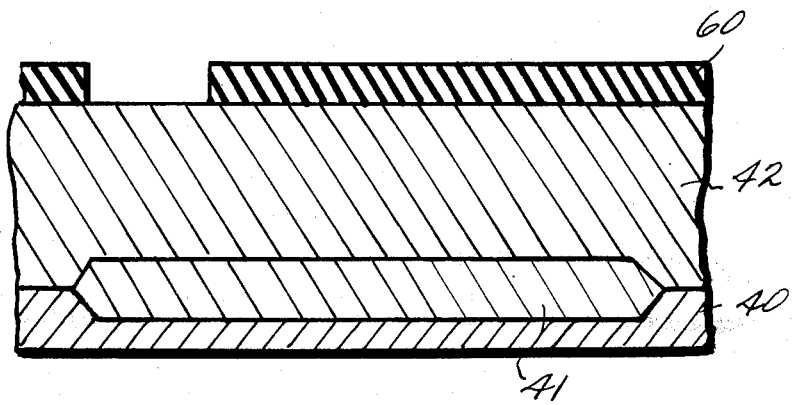
Figure 5C:
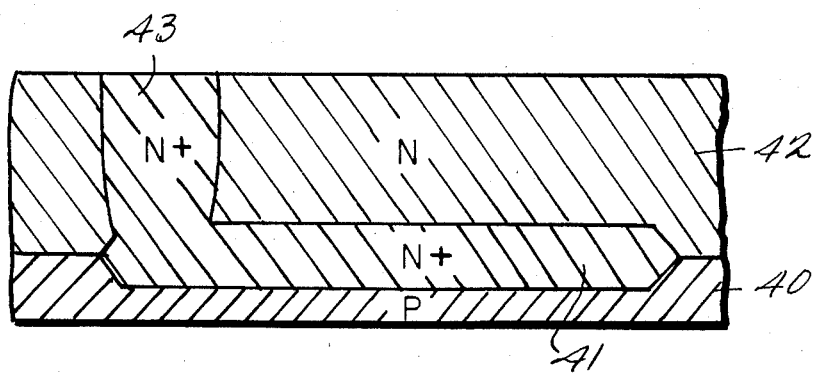

Then a silicon oxide layer 60 is formed on epitaxial layer 42 to a thickness of about 2000 Angstrom (A) by, for example, a thermal oxidation process. Next, oxide layer 60 is photo etched to expose the surface of epitaxial layer 42 (FIG. 5B). Thereafter, impurities, such as arsenic and phosphorus, are diffused into epitaxial layer 42 through opening 61 so as to form N+-type reach-through region 43.

Figure 5D:
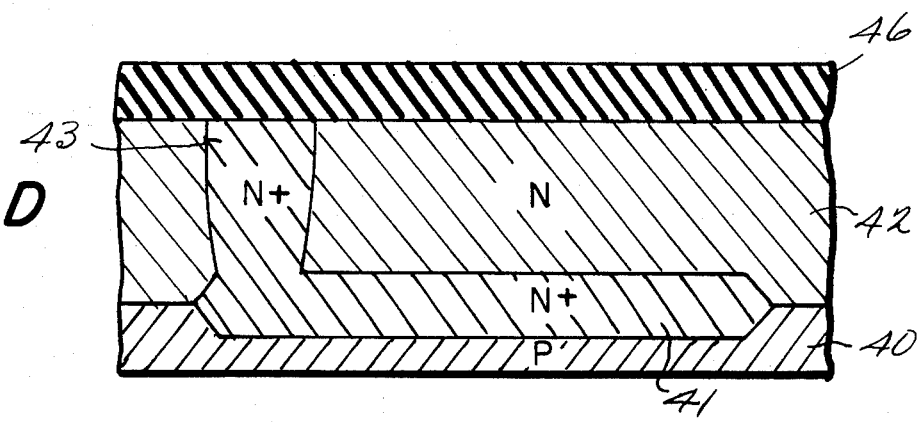
Figure 5E:
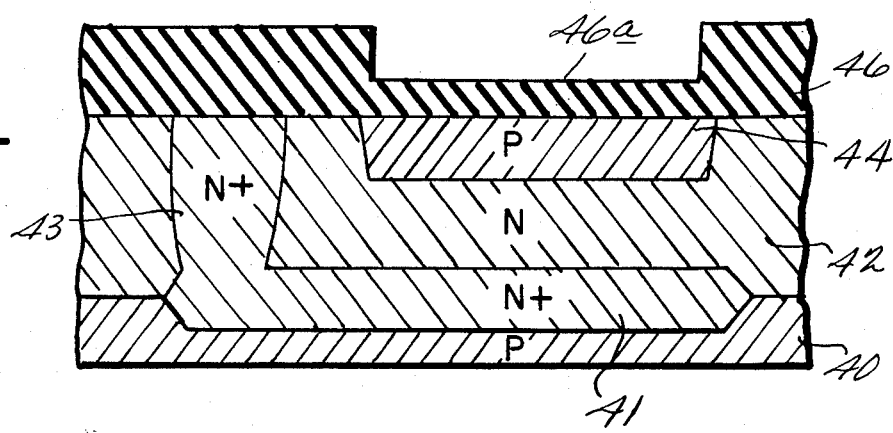

Oxide layer 60 is removed (FIG. 5C), and a new silicon oxide layer 46 is formed on the surface by, for example, a thermal oxidation process (FIG. 5D).

Then, oxide layer 46 is provided with an opening for forming base region 44 about 0.5μ depth, and impurities, such as boron, are diffused into epitaxial layer 42 through the opening (not shown), and a thermal treatment follows to drive-in the impurities into layer 42. By this thermal treatment, a silicon oxide layer 46a, having a thickness of about 1000 A, is formed on base region 44, and the thickness of oxide layer 46 increases to about 3000 A thick.

Next, a silicon nitride layer 47 having a thickness of about 1000 A is formed on oxide layer 46, by utilizing, for example a gaseous phase reaction between silane and ammonia at 850° C. Openings 103, 104 and 105 are then simultaneously formed in nitride layer 47. After provision of these openings, a photoresist layer 70 is formed on nitride layer 47, and then openings 106 and 107 are formed in photoresist layer 70 to expose the edge portions of nitride layer 47.

Figure 5F:
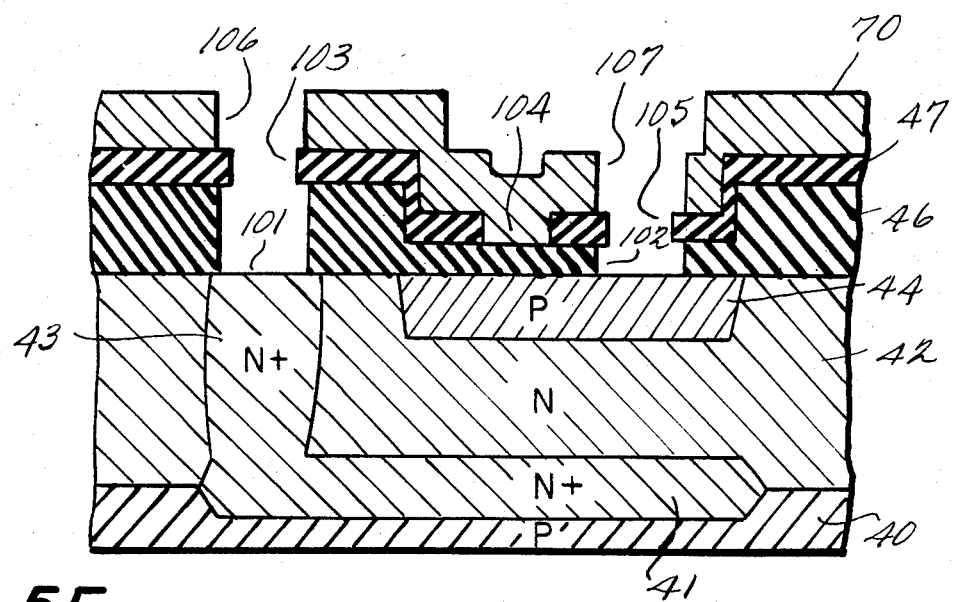

Thereafter openings 101 and 102 are etched in the oxide layer 46. (FIG. 5F). After removal of photoresist layer 70, first and second polycrystalline layers, doped with arsenic, are formed having a thickness of about 500 A and 2500 A, respectively, by a CVD process, and removed except the portions around openings 103 and 105, thus forming first polycrystalline layers 48E, and 48C, and second polycrystalline layers 49E and 49C. The concentration of the impurities in first and second polycrystalline layers 48 and 49 are around $1 \times 10^{21}/cm^3$ to $2 \times 10^{21}/cm^3$ and around $1 \times 10^{20}/cm^3$ to $5 \times 10^{20}/cm^3$, respectively.

Figure 5G:
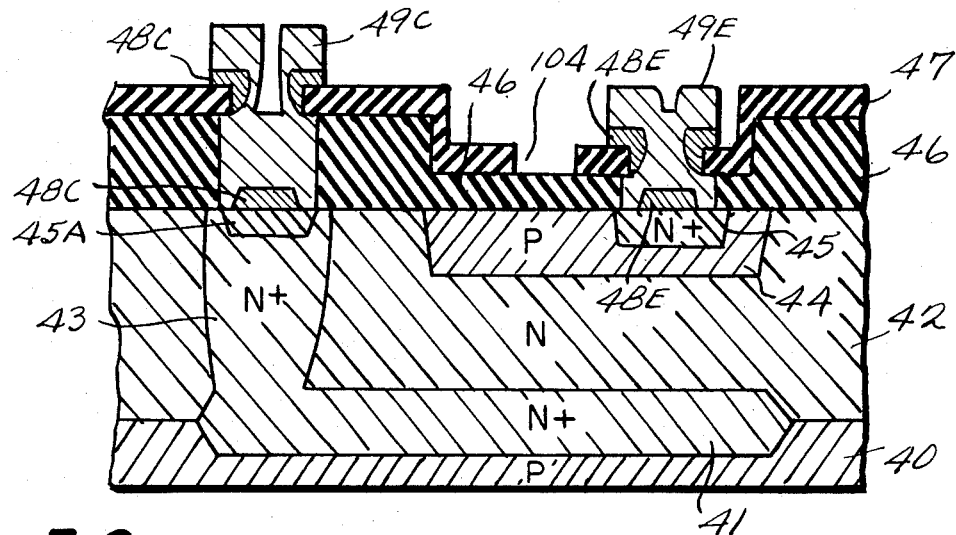

Then a thermal treatment is performed to diffuse the impurities contained in doped polycrystalline layers 48C and 48E into base region 44 to form emitter region 45 and into reach-through region 43 to form region 45A (FIG. 5G). After emitter region 45 has been formed, oxide layer 46A is provided with opening 108, partly exposing the base region 44. It should be noted that neither the polycrystalline layer 49C, 49E nor the silicon nitride layer 47 is etched with ammonium fluoride or hydrofluoric acid, so a photoresist layer like layer 70 shown in FIG. 5F, is not necessary to create opening 108 in oxide layer 46 (FIG. 5H).

Finally, an emitter electrode 50E, a base electrode 50B and a collector electrode 50C are formed.

Figure 1A:
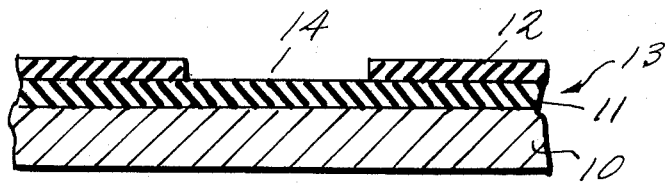
FIGS. 1A to 1E and FIG. 2 are cross sectional views of the structure and method of producing a semiconductor device in the prior art.
Figure 1B:
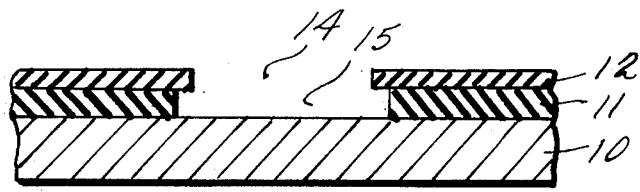
Figure 1C:
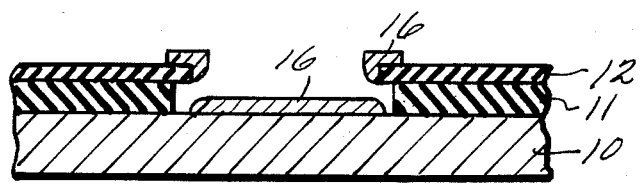
Figure 1D:
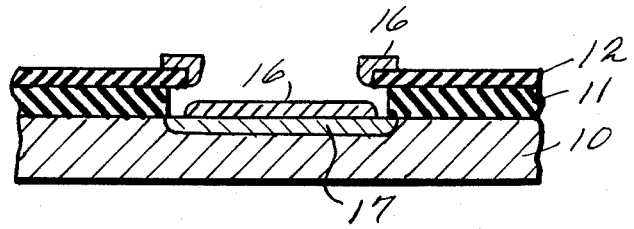
Figure 1E:
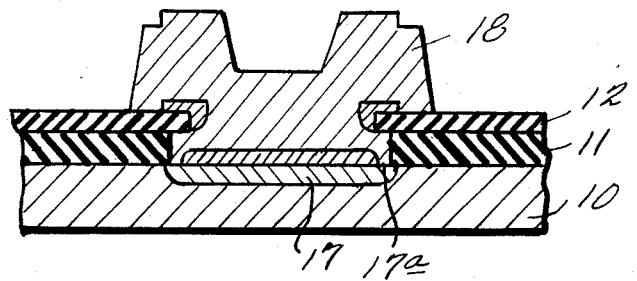
Figure 2:
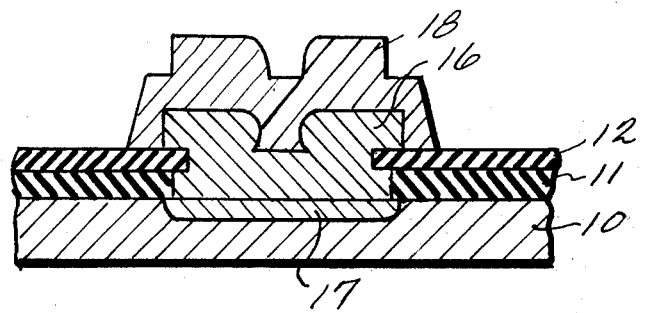

FIG. 6 shows the relationship between the time for forming region 45, namely the emitter of NPN transistor shown in FIG. 4, and the current gain ($h_{FE}$) (lines I and III). Also shown is the breakdown voltage between the collector and emitter of the transistor (lines II and IV). In this diagram, lines I and II are for the NPN transistor according to this invention, as shown in FIG. 4. Lines III and IV are for the prior art device. For this comparison, the prior art device uses the electrode structure shown in FIG. 2 as the emitter and collector electrodes, instead of the structure shown in FIG. 4. Other conditions for the devices are the same, and listed in Table I.

It is observed that the breakdown voltage between collector to emitter ($V_{CEO}$) of the device according to this invention is much higher than that of the prior art device at the same current gain ($h_{FE}$) even if the base depth is shallow, for example below 0.6μ. For exanple, when $h_{FE}$ is 100, the ($V_{CEO}$) of the device according to this invention is 22 V. as compared to 17 V. of the prior art device.

TABLE I

| Item | | Prior Art | This Invention |
|---|---|---|---|
| 1 | Resistance of (41) | 20 Ω/□ | same |
| 2 | Resistance of (42) | 1.5~2 Ω · cm | same |
| 3 | Resistance of (43) | 3~4 Ω/□ | same |
| 4 | Resistance of (44) | 300 Ω/□ | same |
| 5 | Concentration of impurities in (48) | $1\sim2 \times 10^{21}/cm^3$ | same |
| 6 | Concentration of impurities in (49) | N/A | $1\sim5 \times 10^{20}/cm^3$ |
| 7 | Thickness of (48) | 3000 A | 500 A |
| 8 | Thickness of (49) | N/A | 2500 A |

It is apparent from FIG. 6 that more diffusion time is necessary to obtain the same current gain ($h_{FE}$) according to this invention than with the prior art device. However, the time for forming the doped polycrystalline layer in the prior art device is much greater than in the present invention, so that total time for the production of the device according to this invention is much shorter than that for the prior art device. For example, the growth rate of the polycrystalline layer doped with $0.6\sim2\times10^{21}/cm^3$ is about 20 A to 30 A/min., and the growth rate of the $1\sim5\times10^{20}/cm^3$ is about 40 A to 80 A/min. If the growth rate of the highly doped polycrystalline layer is 20 A/min., and the growth rate of the lightly doped polycrystalline layer is 50 A/min., 75 minutes are needed to form the 3000 A polycrystalline layer according to this invention, as compared to 150 minutes for forming the 3000 A highly doped polycrystalline layer in the prior art. To obtain a current gain of 100, the device according to this invention must undergo the diffusion process for 55 minutes, as compared to 45 minutes with the prior art device. So an additional 65 minutes are needed for manufacturing the prior art device over the device according to this invention concerning the formation of the doped polycrystalline layer and the diffusion process using the layer.

It should be noted that in the above mentioned embodiment, the first and second polycrystalline layers contain impurities associated with N-type materials. However, doping with impurities associated with P-type material can be employed to form P-type diffused regions.

While the invention has been particularly shown and described with reference to a preferred embodiment thereof, it will be understood by those skilled in the art that various changes in form and detail may be made therein without departing from the spirit and scope of the invention, which is defined by the following claims.

What is claimed is:

1. A semiconductor structure comprising:
   a semiconductor substrate being of a first conductivity type;
   a first insulation layer formed on said substrate and having at least one opening exposing a portion of said substrate;
   a second insulation layer formed on said first insulation layer and having at least one opening in a position corresponding to said opening in said first insulation layer, said first and second insulation layers being etchable with different etchants so that said second insulation layer is used as a mask for forming said opening in said first insulation layer by etching, a portion of said second insulation layer overhanging said first insulation layer as a result of said etching;
   a first polycrystalline semiconductor layer formed on said exposed substrate and containing impurities associated with a second conductivity type opposite said first conductivity type at a first concentration sufficiently high to convert the conductivity type of said substrate upon diffusion;
   a second polycrystalline semiconductor layer formed on said first polycrystalline layer, and containing impurities associated with said second conductivity type at a second concentration lower than said first concentration, the ratio of said first concentration and said second concentration being in the range of 1.5 to 100, said second polycrystalline semiconductor layer being three to ten times thicker than said first polycrystalline semiconductor layer;
   a metal electrode formed on said second polycrystalline layer; and
   a diffused region being of said second conductivity type formed beneath said first polycrystalline layer in said substrate,
   said second polycrystalline layer formed on said first polycrystalline layer prohibiting shorting between said metal electrode and said substrate and preventing breakage with respect to said overhanging portion of said second insulation layer.

2. A semiconductor structure according to claim 1 wherein the concentration of impurities in said first polycrystalline layer is in the range of $0.6\times10^{21}$ to $2\times10^{21}/cm^3$, and the concentration of impurities in said second polycrystalline layer is in the range $1\times10^{20}$ to $5\times10^{20}/cm^3$.

3. A semiconductor structure according to claim 1, wherein said first insulation layer is made of a silicon oxide, and said second insulation layer is made of silicon nitride.

4. A semiconductor structure according to claim 1, wherein the total thickness of said first and second polycrystalline layers is greater than half the thickness of said first insulation layer.

* * * * *